United States Patent
Wang et al.

(10) Patent No.: US 8,365,026 B2
(45) Date of Patent: Jan. 29, 2013

(54) METHODS FOR PERFORMING FAIL TEST, BLOCK MANAGEMENT, ERASING AND PROGRAMMING IN A NONVOLATILE MEMORY DEVICE

(75) Inventors: Jong Hyun Wang, Cheongju-si (KR); Chae Kyu Jang, Icheon-si (KR); Se Chun Park, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 790 days.

(21) Appl. No.: 12/130,994

(22) Filed: May 30, 2008

(65) Prior Publication Data

US 2009/0172482 A1 Jul. 2, 2009

(30) Foreign Application Priority Data

Dec. 28, 2007 (KR) ........................ 10-2007-0140146

(51) Int. Cl.
*G11C 29/44* (2006.01)
*G11C 29/56* (2006.01)

(52) U.S. Cl. ........................................ 714/723; 714/733
(58) Field of Classification Search .................. None
See application file for complete search history.

(56) References Cited

U.S. PATENT DOCUMENTS

| 5,457,791 A * | 10/1995 | Matsumoto et al. ........... 714/5.1 |
| 5,835,430 A * | 11/1998 | Henning et al. ............... 365/201 |
| 5,864,661 A * | 1/1999 | Ohara ............................. 714/42 |
| 5,892,896 A * | 4/1999 | Shingo ......................... 714/6.13 |
| 6,158,028 A * | 12/2000 | Imura ............................ 714/718 |
| 6,671,274 B1 * | 12/2003 | Ding et al. .................... 370/389 |
| 7,532,531 B2 * | 5/2009 | Lee ................................. 365/218 |
| 2002/0199142 A1 * | 12/2002 | Gefen ........................... 714/724 |
| 2007/0011395 A1 * | 1/2007 | Kim ................................ 711/103 |
| 2007/0245070 A1 * | 10/2007 | Mitsunaga .................... 711/103 |
| 2008/0137415 A1 * | 6/2008 | Lee ........................... 365/185.03 |

FOREIGN PATENT DOCUMENTS

| JP | 05-100800 | | 4/1993 |
| JP | 05100800 A | * | 4/1993 |
| KR | 1020010069211 A | | 7/2001 |
| KR | 1020010070347 A | | 7/2001 |

* cited by examiner

*Primary Examiner* — Ajay Bhatia
*Assistant Examiner* — Dipakkumar Gandhi
(74) *Attorney, Agent, or Firm* — Kilpatrick Townsend & Stockton LLP

(57) ABSTRACT

Methods for performing a fail test, block management, erase operations and program operations are used in a nonvolatile memory device having a block switch devoid of a fuse and a PMOS transistor. A method for performing a fail test in a nonvolatile memory device includes performing a fail test for a memory cell block; storing good block information in a block information store associated with the corresponding block when the memory cell block is a good block; and repeating the performing and storing steps for all memory cell blocks.

18 Claims, 6 Drawing Sheets

METHODS FOR PERFORMING FAIL TEST, BLOCK MANAGEMENT, ERASING AND PROGRAMMING IN A NONVOLATILE MEMORY DEVICE

CROSS-REFERENCES TO RELATED APPLICATIONS

The present application claims priority to Korean patent application number 10-2007-140146, filed on Dec. 28, 2007, which is incorporated by reference in its entirety.

BACKGROUND OF THE INVENTION

The present invention relates to methods for performing block management, erase operations and program operations in a nonvolatile memory device.

Recently, demand for nonvolatile memory devices has increased. Nonvolatile memory devices are electrically programmable and erasable and do not need a refresh function for periodically refreshing data.

In general, a nonvolatile memory device includes memory cell arrays in which cells for storing data are arranged in the shape of a matrix and page buffers which write data into specified cells of the memory cell arrays or read the data stored in specified cells of the memory cell arrays. The page buffers include pairs of bit lines which are connected with specified memory cells, registers for temporarily storing data to be written into memory cell arrays or the data read from the specified cells of memory cell arrays, sensing nodes for sensing the voltage levels of specified bit lines or specified registers, and bit line select sections for controlling the connection between the specified bit lines and the sensing nodes.

In the nonvolatile memory device configured as described above, operation is performed by the unit of a block in which unit memory cell arrays are included. If a failure occurs while testing blocks, the entire memory device is not disposed. Instead, processing is conducted such that bad (i.e., improperly functioning) blocks are not used. This is called bad block management. A bad block includes a cell which is not programmed over a specified threshold voltage even though a is plurality of programming and verifying operations has been performed. In the conventional nonvolatile memory device, if a failure occurs in a circuit during a test, the fuse included in the block switch of a corresponding block is blown such that the corresponding block is not selected. However, the fuse included in each block and a PMOS transistor for supplying a high level voltage to a specified node to blow the fuse occupy a substantial space in the circuit.

SUMMARY OF THE INVENTION

Embodiments of the present invention are directed to methods for performing a fail test and block management, which can be used in a nonvolatile memory device having a block switch devoid of a fuse and a PMOS transistor.

Embodiments of the present invention are also directed to methods for performing erase and program operations in a nonvolatile memory device, which can be used when adopting the method for performing block management.

In one aspect, a method for performing a fail test in a nonvolatile memory device comprises the steps of performing a fail test for a memory cell block; storing good block information in a block information store of the corresponding block when the memory cell block is a good block; and repeating the above steps for other memory cell blocks, wherein the good block information includes binary data.

In another aspect, a method for performing block management in a nonvolatile memory device comprises the steps of preparing the nonvolatile memory device having undergone the fail testing method described above; reading the data stored in the block information store of the memory cell block; storing an address of the corresponding block in a good block table when the memory cell block is identified as a good block as a result of reading; and repeating the reading step and the storing step for all other memory cell blocks.

In another aspect, a method for performing block management in a nonvolatile memory device comprises the steps of preparing the nonvolatile memory device having undergone the fail testing method described above; reading the data stored in the block information store of the memory cell block; storing an address of the corresponding block in a bad block table when the memory cell block is identified as not a good block as a result of the reading; and repeating the reading step and the storing step for all other memory cell blocks.

In still another aspect, a method for performing an erase operation in a nonvolatile memory device comprises the steps of performing an erase operation for a specified memory cell block; performing an erase verification for the performed erase operation; storing an address of the corresponding memory cell block in a good block table when the erase verification is complete; and storing good block information in a block information store associated with the memory cell block.

In a still further aspect, a method for performing a program operation in a nonvolatile memory device comprises the steps of performing a program operation on a per page basis for a memory cell block; performing a program verification for the performed program operation; deleting an address of the memory cell block stored from a good block table when the program verification cannot be completed; and storing bad block information in a block information store of the corresponding memory cell block.

DESCRIPTION OF SPECIFIC EMBODIMENTS

Figure 1:
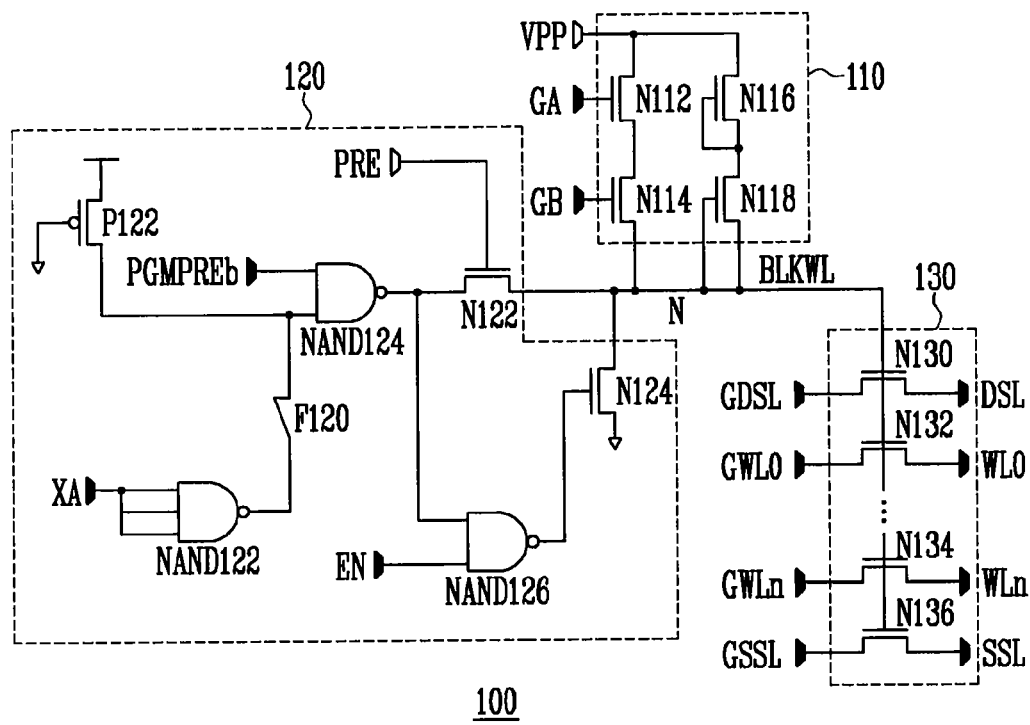
FIG. 1 is a circuit diagram illustrating a block switch of a conventional nonvolatile memory device.

Reference will now be made in greater detail to specific embodiments of the invention, examples of which are illustrated in the accompanying drawings. It is to be noted that the present invention must not to be construed as being limited by these embodiments and can be realized in a variety of ways. These embodiments are provided to make the disclosure of the present invention complete and to allow the person having ordinary knowledge in the art to better understand the scope of the present invention. The same reference numerals will be used throughout the drawings and the description to refer to the same parts.

FIG. 1 is a circuit diagram illustrating a block switch of a conventional nonvolatile memory device.

A block switch 100 includes a precharge section 110 for precharging a block word line BLKWL to a high level in response to precharge control signals GA and GB, a discharge section 120 for discharging the block word line BLKWL to a low level in response to a block address signal XA and various control signals PGMPREb, EN and PRE, and a high voltage switching section 130 for permitting or interrupting the application of a high voltage to word lines depending on whether a corresponding block is selected.

The precharge section 110 includes NMOS transistors N112 and N114 which are respectively turned on in response to the precharge control signals GA and GB and are connected in series, and NMOS transistors N116 and N118 which are diode-connected in series to transmit a high voltage VPP.

In the precharge section 110, if the precharge control signals GA and GB having a high level are applied, the respective transistors N112 and N114 are turned on and precharge the block word line BLKWL to a high level.

If the precharge control signals GA and GB having a low level are applied, the diode-connected transistors N116 and N118 precharge the block word line BLKWL to a high level voltage that is increased by a threshold voltage.

The discharge section 120 includes a PMOS transistor P122 for supplying a power source voltage, a first NAND gate NAND122 for receiving the block address signal XA as inputs, a fuse F120 having one terminal which is connected in series with the output terminal of the first NAND gate NAND122 and the other terminal which is connected in parallel with the drain of the PMOS transistor P122, a second NAND gate NAND124 for receiving as inputs the first control signal PGMPREb and the signal transmitted from the connection node between the PMOS transistor P122 and the fuse F120, a first NMOS transistor N122 for transmitting the output of the second NAND gate NAND124 to the block word line BLKWL in response to the second control signal PRE, a third NAND gate NAND126 for receiving as inputs a block enable signal EN and the output signal of the second NAND gate NAND124, and a discharge transistor N124 for grounding the block word line BLKWL in response to the output of the third NAND gate NAND126.

A high level voltage is applied to the second NAND gate NAND124 by the PMOS transistor P122. If a certain block is selected during operation of a nonvolatile memory device, the block address signal XA is input at a logic high level. Accordingly, the output of the first NAND gate NAND122 has a logic low level.

Depending on whether the corresponding block is bad (i.e., functioning improperly) or good (i.e., functioning properly), the state of the fuse F120 is determined. A bad block includes a cell which is not programmed over a specified threshold voltage even though a plurality of programming and verifying operations has been performed. Similarly, a good block includes only cells which are programmed over a specified threshold voltage when a plurality of programming and verifying operations has been performed. On the basis of this determination, input data to the second NAND gate NAND124 varies. The state of the fuse F120 is determined by a test that is conducted after the manufacture of the nonvolatile memory device is completed.

That is to say, if the corresponding block is bad, the fuse F120 is physically blown such that a high level voltage is applied to the second NAND gate NAND124. As a result, when the first control signal PGMPREb having a high level is applied, the second NAND gate NAND124 outputs a signal having a low level, and this signal is transmitted to the block word line BLKWL by the second control signal PRE. The signal is also transmitted to the third NAND gate NAND126 such that the third NAND gate NAND126 outputs a signal having a high level. As a result, the discharge transistor N124 is driven and applies a ground voltage to the block word line BLKWL. Thus, the high voltage switching section 130 is not driven, and the corresponding block does not operate. In other words, the corresponding block is not selected.

Conversely, if the corresponding block is determined to be good as a result of a test, the fuse F120 remains connected. If the corresponding block is selected by the block address signal XA, the low level signal output from the first NAND gate NAND122 is transmitted to the second NAND gate NAND124. As a result, irrespective of the first control signal PGMPREb, the second NAND gate NAND124 outputs a high level voltage.

Since the output of the second NAND gate NAND124 has a logic high level, the discharge transistor N124 is turned off in response to the block enable signal EN.

Namely, when the block enable signal EN having a high level is input, because the third NAND gate NAND126 outputs a low level voltage, the discharge transistor N124 is turned off, and a discharge operation does not occur. Since a high level voltage is transmitted to the high voltage switching section 130 by the precharge section 110, the corresponding block can operate.

The high voltage switching section 130 permits or interrupts the transmission of the high voltage through global word lines GWL, a global drain select line GDSL and a global source select line GSSL depending on whether the memory cell block is selected. When performing program, erase, verify and read operations, if a specified block is selected, the supply of the high voltage to the respective word lines is permitted, and if the specified block is not selected, the supply of the high voltage to the respective word lines is interrupted.

The high voltage switching section 130 includes interrupt transistors N130, N132, N134 and N136 which are connected between the respective global voltage supply lines GDSL, GSSL and GWL and the memory cells of the memory cell block and the gates of drain and source select transistors.

In summary, whether a specified block is bad or good is determined and stored during a test depending on whether the fuse F120 is blown. Also, a bad block can be produced during the operation of the nonvolatile memory device. Corresponding information is stored in a spare cell which is included in each block. The stored information is transmitted via the block address signal XA by a central control unit.

However, the block switch 100 includes the PMPS transistor P122 for supplying a power source voltage and the fuse F120 which occupy a substantial area. Thus, it is desirable to remove these parts.

A method for performing block management in the conventional nonvolatile memory device will be described below.

Figure 2:
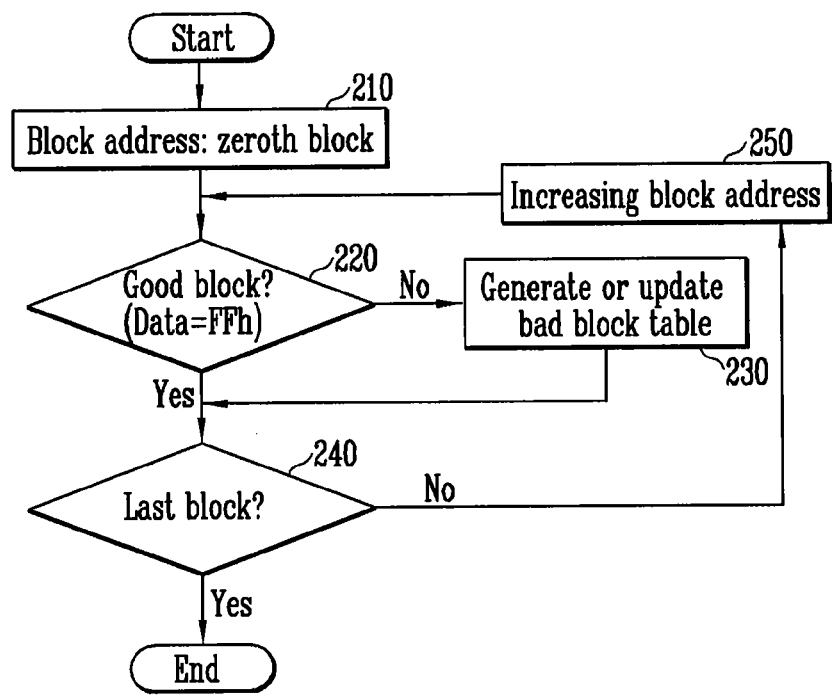
FIG. 2 is a flow chart illustrating a method for performing block management in the conventional nonvolatile memory device.

FIG. 2 is a flow chart illustrating a method for performing block management in the conventional nonvolatile memory device.

A nonvolatile memory device includes a plurality of blocks in accordance with the capacity thereof. For example, a nonvolatile memory device having a capacity of 16 Gbits includes a total of 16,384 blocks. The number of blocks can be changed by a designer.

Among these blocks, a block having a plurality of bad cells that may function improperly due to a faulty manufacturing procedure is classified as a bad block, and the fuse thereof as shown in FIG. 1 is blown. That is to say, whether a block is identified as bad or good depends on whether the fuse is blown. After the fuse is blown, by performing an erase operation for the entire block, 'FFh' data can be stored in each storage for storing information regarding whether a corresponding block is bad or good. The storage is called a block information storage. The block information storage is provided in a spare cell of each block. In contrast to the main cells in which externally input data is stored, the spare cell stores various parameters which are essential to the driving of the nonvolatile memory device. The information regarding whether a corresponding block is bad or good is stored in the spare cell.

In the block information storage of the block which is classified as a bad block and has a blown fuse, 'FFh' data is not stored even though the erase operation is performed. This is because the corresponding block is not selected due to the blown fuse and, therefore, an erase voltage is not applied thereto.

When a nonvolatile memory device has undergone various tests and is packaged, in the case of a good block, 'FFh' data indicating that the block is a good block is stored in the corresponding block information storage, and in the case of a bad block, 'FFh' data is not stored in the corresponding block information storage.

A bad block may occur during the operation of the nonvolatile memory device.

When performing a verify operation, if a cell which is not programmed over a specified threshold voltage is found even though a plurality of program and verify operations has been performed, the block having the corresponding cell may be classified as a bad block. That is to say, when verification completion signals are transmitted from respective page buffers, both the cells, which are programmed over a specified threshold voltage, and the cells, which are erased, output the verification completion signals having the same level (for example, a high level). However, in the case that verification cannot be completed for a certain cell, the verification completion signals having different levels are output. Therefore, a determination can be made whether a block is bad or good.

In this procedure, if a block is classified as a bad block, data (for example, '00h' data) indicating that the corresponding block is bad is stored in the block information storage of the corresponding block. When information regarding whether a block is bad or good is stored in the block information storage of the block, a method for performing block management is performed.

A method for performing block management in the conventional nonvolatile memory device will be described below.

A first block among a plurality of blocks is initially set as a target of the block management (210).

The reference for setting a first target of the block management can be changed by a designer. For example, the block management can be performed in an ascending order or a descending order of block addresses.

A determination is then made whether the target block is bad or good (220).

This determination can be effected by reading the information stored in the block information storage. For example, when the data stored in a spare cell is 'FFh', it is determined that the corresponding block is good, and in the other cases, it is determined that the corresponding block is bad.

If it is determined in step 220 that the corresponding block is bad, a bad block table is generated and stored, or an already generated bad block table is updated (230).

The bad block table is included in the control unit of the nonvolatile memory device, and the information associated with the blocks is stored in the bad block table.

If it is determined in step 220 that the corresponding block is good, the target of the block management is changed to a different block (240 and 250).

That is to say, a determination is made whether the current target block is the last block of the plurality of blocks (240). If the current target block is the last block, the block management is complete. Otherwise, a block address is increased (250), and the target block is changed to the block corresponding to the block address.

When the last block is checked, the block management is complete.

In the above-described conventional method for performing block management, a determination is made whether each block is bad or good, and the information for a bad block is separately stored.

In the case that the PMOS transistor P122 and the fuse F120 are removed from the block switch as mentioned above, since it is necessary to provide reliable information regarding whether respective blocks are bad or good, a new method for performing block management is required.

Figure 3:
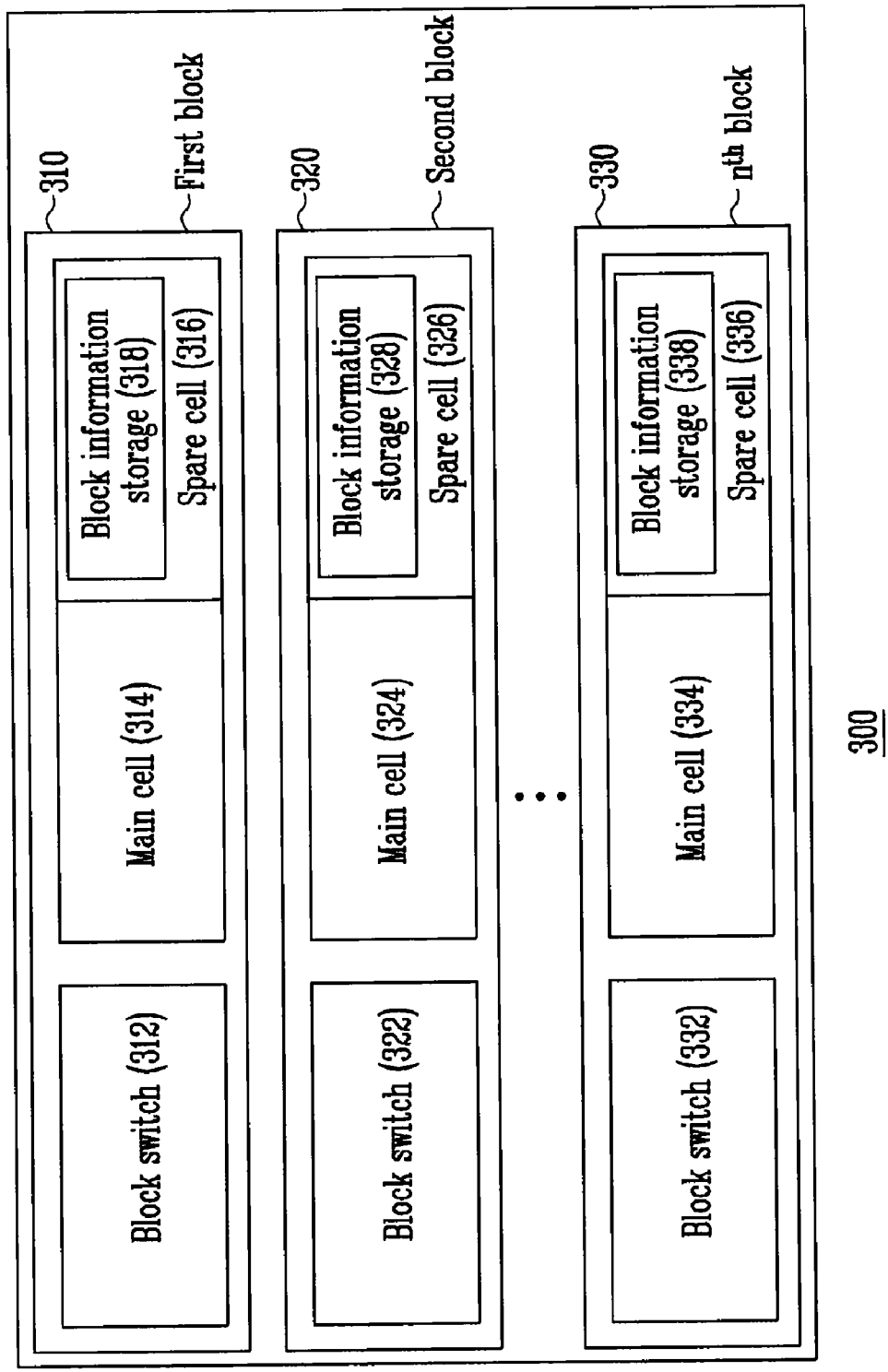
FIG. 3 is a view illustrating a nonvolatile memory device to which the present invention is applied.

FIG. 3 is a view illustrating a nonvolatile memory device to which the present invention is applied.

A nonvolatile memory device 300 has a plurality of blocks 310, 320 and 330.

The respective blocks 310, 320 and 330 include block switches 312, 322 and 332 for applying a high voltage to the corresponding blocks 310, 320 and 330 depending on whether the corresponding blocks 310, 320 and 330 are selected, main cells 314, 324 and 334 to and from which data is input and output, spare cells 316, 326 and 336 in which various parameters for driving of the nonvolatile memory device are stored, and block information storages 318, 328 and 338 in which information identifying whether the corresponding blocks 310, 320 and 330 are bad or good is stored.

Figure 4:
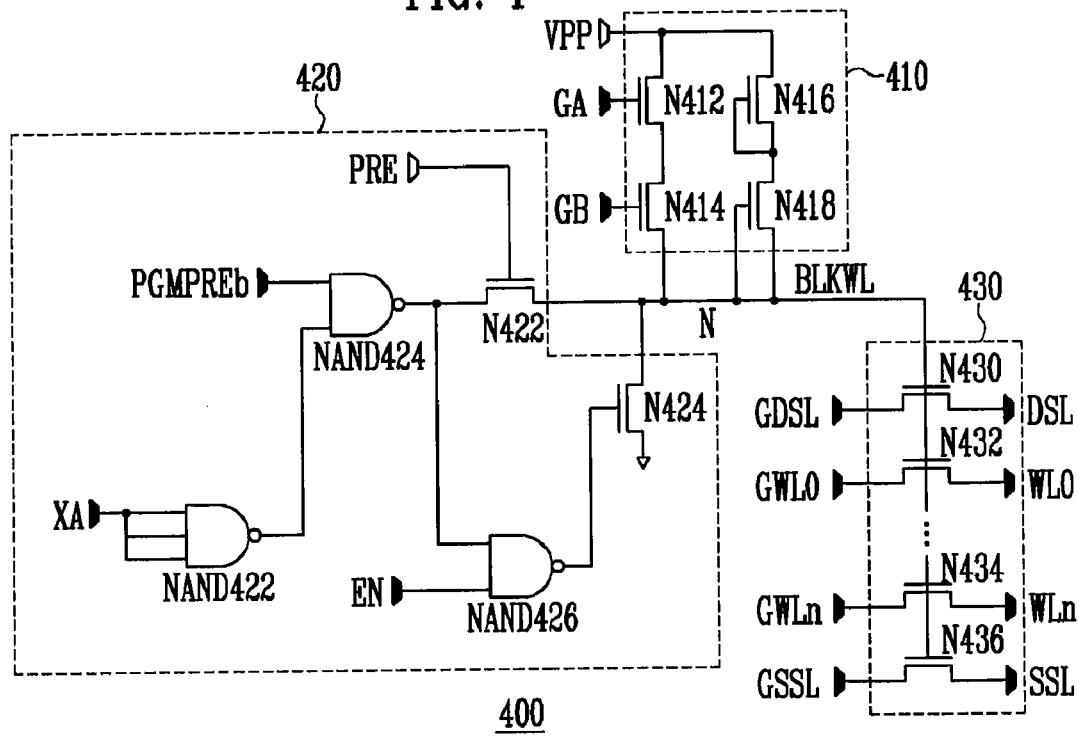
FIG. 4 is a circuit diagram illustrating a block switch of the nonvolatile memory device to which the present invention is applied.

FIG. 4 is a circuit diagram illustrating a block switch of a nonvolatile memory device to which the present invention is applied.

A block switch 400 includes a precharge section 410 for precharging a block word line BLKWL to a high level in response to precharge control signals GA and GB, a discharge section 420 for discharging the block word line BLKWL to a low level in response to a block address signal XA and various control signals PGMPREb, EN and PRE, and a high voltage switching section 430 for permitting or interrupting the application of a high voltage to word lines depending on whether a corresponding block is selected.

The precharge section 410 includes NMOS transistors N412 and N414 which are respectively turned on in response to the precharge control signals GA and GB and are connected in series, and NMOS transistors N416 and N418 which are diode-connected in series to transmit a high voltage VPP.

In the precharge section 410, if the precharge control signals GA and GB having a high level are applied, the respective transistors N412 and N414 are turned on and precharge the block word line BLKWL to a high level.

If the precharge control signals GA and GB having a low level are applied, the diode-connected transistors N416 and N418 precharge the block word line BLKWL to a high level voltage that is increased by a threshold voltage.

The discharge section 420 includes a first NAND gate NAND422 for receiving the block address signal XA as inputs, a second NAND gate NAND424 for receiving as inputs the first control signal PGMPREb and the signal transmitted from the first NAND gate NAND422, a first NMOS transistor N422 for transmitting the output of the second NAND gate NAND424 to the block word line BLKWL in response to the second control signal PRE, a third NAND gate NAND426 for receiving as inputs a block enable signal EN and the output signal of the second NAND gate NAND424, and a discharge transistor N424 for grounding the block word line BLKWL in response to the output of the third NAND gate NAND426.

Thus, the PMOS transistor P122 and the fuse F120 shown in FIG. 1 are not included in the block switch 400. Therefore, a determination result of whether a block is bad or good, which is obtained during a test, is not physically stored.

If a certain block is selected during various operations of a nonvolatile memory device, the block address signal XA is input at a logic high level. Accordingly, the output of the first NAND gate NAND422 has a logic low level.

As a result, when the first control signal PGMPREb having a high level is applied, the second NAND gate NAND424 outputs a signal having a high level. This signal is transmitted to the block word line BLKWL by the second control signal PRE.

Since the output of the second NAND gate NAND424 has a logic high level, the discharge transistor N424 is turned off in response to the block enable signal EN.

Namely, when the block enable signal EN having a high level is input, because the third NAND gate NAND426 outputs a low level voltage, the discharge transistor N424 is turned off, and a discharge operation does not occur. Since a high level voltage is transmitted to the high voltage switching section 430 by the precharge section 410, the corresponding block can operate.

If the block address signal XA is not input at a logic high level, the output of the first NAND gate NAND422 has a logic high level.

As a result, when the first control signal PGMPREb having a high level is applied, the second NAND gate NAND424 outputs a signal having a low level. This signal is transmitted to the block word line BLKWL by the second control signal PRE.

Since the output of the second NAND gate NAND424 has a logic low level, the discharge transistor N424 is turned on in response to the block enable signal EN.

Namely, when the block enable signal EN having a high level is input, because the third NAND gate NAND426 outputs a high level voltage, the discharge transistor N424 is turned on, and a discharge operation occurs. In other words, as the discharge transistor N424 is driven, a ground voltage is applied to the block word line BLKWL. Thus, the high voltage switching section 430 is not driven, and the corresponding block does not operate. In other words, the corresponding block is not selected.

The high voltage switching section 430 permits or interrupts the transmission of the high voltage through global word lines GWL, a global drain select line GDSL and a global source select line GSSL depending on whether the memory cell block is selected. When performing program, erase, verify and read operations, if a specified block is selected, the supply of the high voltage to the respective word lines is permitted, and if the specified block is not selected, the supply of the high voltage to the respective word lines is interrupted.

The high voltage switching section 430 includes interrupt transistors N430, N432, N434 and N436 which are connected between the respective global voltage supply lines GDSL, GSSL and GWL and the memory cells of the memory cell block and the gates of drain and source select transistors.

In summary, in the block switch 400 shown in FIG. 4, the information identifying whether a block is bad or good is not physically stored through a test. Instead, whether a block is bad or good is determined during operation of the corresponding block and is stored in the block information storage of each block. Based on the information stored in the block information storage, block management is performed.

Since a fuse is not used in the block switch 400 unlike the conventional art, while the occupied area of a chip can be decreased, the reliability of the information regarding whether a block is bad or good may be slightly degraded. In order to compensate for this, the present invention provides a separate method for performing block management.

Figure 5:
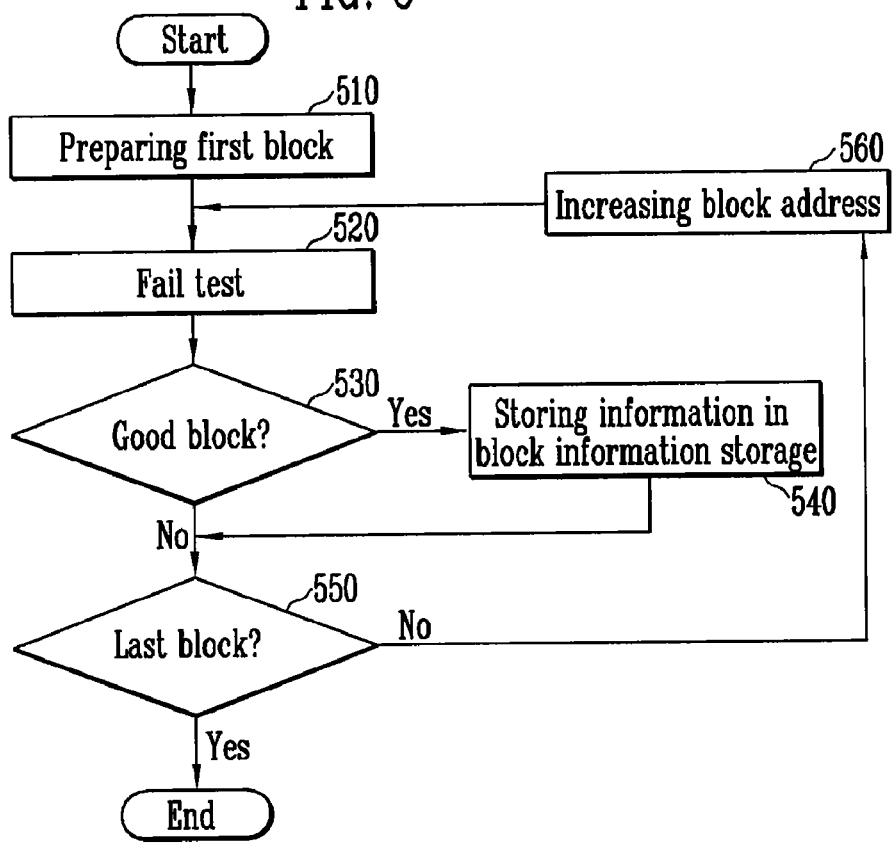
FIG. 5 is a flow chart illustrating a method for performing a fail test in a nonvolatile memory device in accordance with an embodiment of the present invention.

FIG. 5 is a flow chart illustrating a method for performing a fail test in a nonvolatile memory device in accordance with an embodiment of the present invention.

First, a block to be tested is prepared (510).

Next, a fail test is performed for the prepared block (520).

The fail test is performed in the same manner as the conventional art. For example, if a cell which is not programmed over a specified threshold voltage is found even though a plurality of programming and verifying operations has been performed, the block having the corresponding cell can be classified as a bad block.

If a block is determined to be a good block as a result of the test (530), data indicating that the corresponding block is good is stored in the block information storage of the corresponding block (540).

Preferably, a setting is made such that data such as 'AAh', 'ABh', 'ACh', 'ADh', 'AEh', 5Ah, 55h, A5h and so on, in which binary digits (e.g., 1 and 0) are included, is stored as the information indicating that the corresponding block is good. For example, when converting data '00h' into a binary code, since '00000000' is obtained, the data is degraded to some extent in the reliability thereof to be used as the information for indicating a good block when compared with the above data. That is to say, in the case of the data 'AAh', when converting it into a binary code, since '10101010' is obtained, it is possible to easily check if an error is included in the corresponding data due to an external factor. Furthermore, in the case of the data '00h' and 'FFh', since they can also be obtained even when a corresponding cell is completely erased or completely programmed, the above binary code data are preferably used such that they can be distinguished from the data '00h' and 'FFh'.

In the case of the block which is identified as a bad block as a result of the test, separate data is not stored in the block information storage. That is to say, when a certain block is identified as a bad block, it may be impossible to program specified data into the block information storage which is included in the corresponding block. Even when the specified data is programmed, it is unlikely that the specified data can be read as it is. In other words, when a certain block is identified as a bad block, a separate program operation is not performed. Accordingly, by programming the data, in which binary digits are included, into the block information storage of a block identified as a good block, a configuration for clearly distinguishing the good block from a bad block is attained.

A determination is made whether the current block is the last block of the plurality of blocks (550). If the current block is the last block, the test is complete. Otherwise, a block address is increased (560), and a block corresponding to the increased block address is tested.

When the last block is checked, the test is complete.

In this way, the fail test is performed for the plurality of blocks, and specified data are stored in the block information storages of the respective blocks.

Thereafter, in the operation of the nonvolatile memory device, block management is performed based on the data stored in the block information storages.

Figure 6:
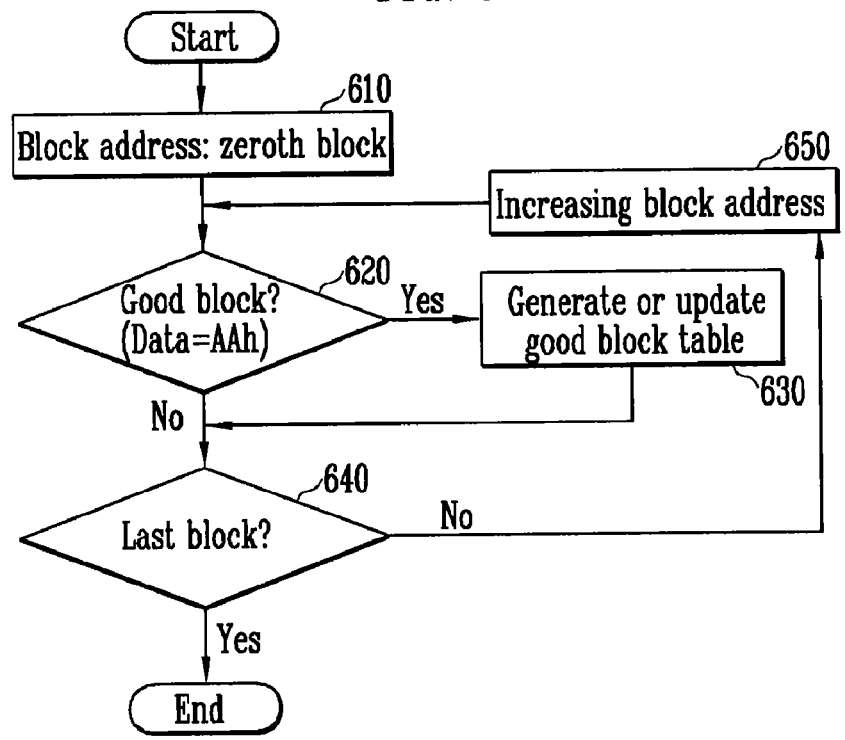
FIG. 6 is a flow chart illustrating a method for performing block management in a nonvolatile memory device in accordance with another embodiment of the present invention.

FIG. 6 is a flow chart illustrating a method for performing block management in a nonvolatile memory device in accordance with another embodiment of the present invention.

A first block of a plurality of blocks is initially set as a target of the block management (610).

The reference for setting a first target of the block management can be changed by a designer. For example, the block management can be performed in an ascending order or a descending order of block addresses.

A determination is made whether the target block is good (620).

This determination can be effected on the basis of the information stored in the block information storage. That is to say, a fail test as shown in FIG. 5 is not directly performed. Instead, the determination is made based on whether the information stored in the block information storage corresponds to the information that identifies a good block.

Preferably, when the information stored in the block information storage corresponds to the information stored in step 540 of FIG. 5, the block is identified as a good block. In other words, when the data such as 'AAh', 'ABh', 'ACh', 'ADh', 'AEh', 5Ah, 55h, A5h and so on, in which binary digits are included, is stored as the information indicating that the corresponding block is good and when the same data is read out, the block is identified as a good block.

If it is determined in step 620 that the corresponding block is a good block, a good block table is generated and stored, or an already generated good block table is updated (630).

The good block table is included in the control unit of the nonvolatile memory device, and the information of good blocks among the plurality of blocks is stored in the good block table.

If it is determined in step 620 that the corresponding block is a bad block, the target of the block management is changed to another block (640 and 650).

If it is determined in step 620 that the corresponding block is not a good block, the corresponding block is identified as a bad block.

A determination is made whether the current target block is the last block of the plurality of blocks (640). If the current target block is the last block, the block management is complete. Otherwise, a block address is increased (650), and the target block is changed to the block corresponding to the increased block address.

When the last block is checked, the block management is ended.

In accordance with another embodiment, a method of generating a bad block table after determining whether a corresponding block is good can be used.

Figure 7:
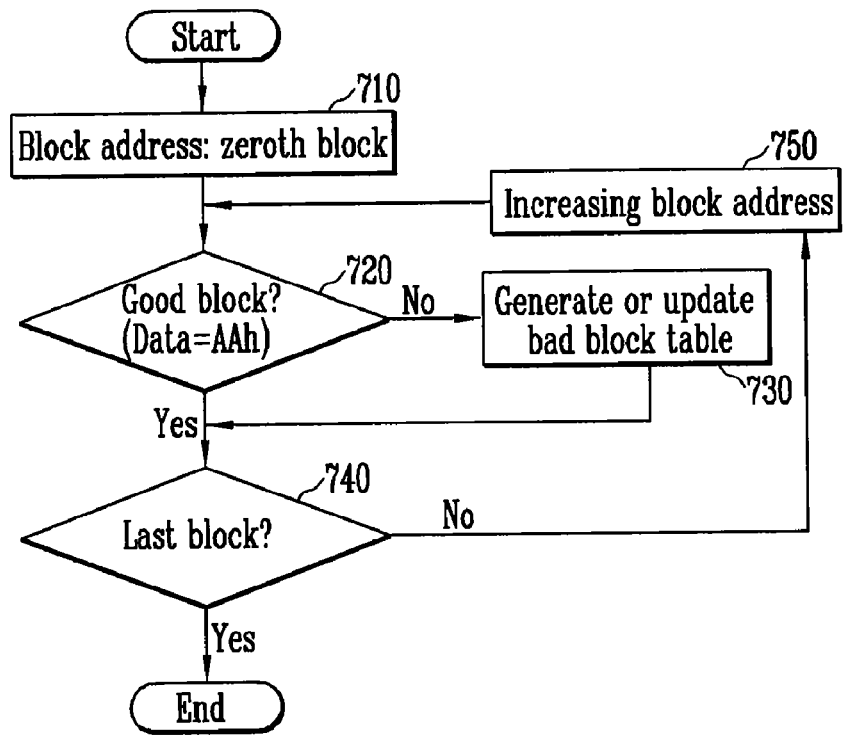
FIG. 7 is a flow chart illustrating a method for performing block management in a nonvolatile memory device in accordance with another embodiment of the present invention.

FIG. 7 is a flow chart illustrating a method for performing block management in a nonvolatile memory device in accordance with another embodiment of the present invention.

The method according to the present embodiment is similar to the method of FIG. 6 except that the procedure after determining whether a corresponding block is a good block is different.

In the present method, if the information stored in the block information storage is different from the data for a good block, it is determined that the corresponding block is a bad block. A bad block table is then generated and stored, or an already generated bad block table is updated (730).

The bad block table is included in the control unit of the nonvolatile memory device, and the information of bad blocks of the plurality of blocks is stored in the bad block table.

If it is determined in step 720 that the corresponding block is a good block, the target of the block management is changed to a different block (740 and 750).

If it is determined in step 720 that the corresponding block is not a bad block, the corresponding block is identified as a good block.

A determination is made whether the current target block is the last block of the plurality of blocks (740). If the current target block is the last block, the block management is complete. Otherwise, a block address is increased (750), and the target block is changed to the block corresponding to the increased block address.

When the last block is checked, the block management is ended.

When it is necessary to perform erase or program operations while the block management method according to the present invention is performed, an operation for separately managing the data stored in the block information storage is performed. That is to say, when the erase operation is performed for an entire block, since the data stored in the block information storage is changed by the erase operation, an operation for reestablishing the data is required. Also, when the program operation is performed for a page, if verification cannot be completed and a failure occurs, operation for managing a corresponding block as a bad block is required.

Figure 8:
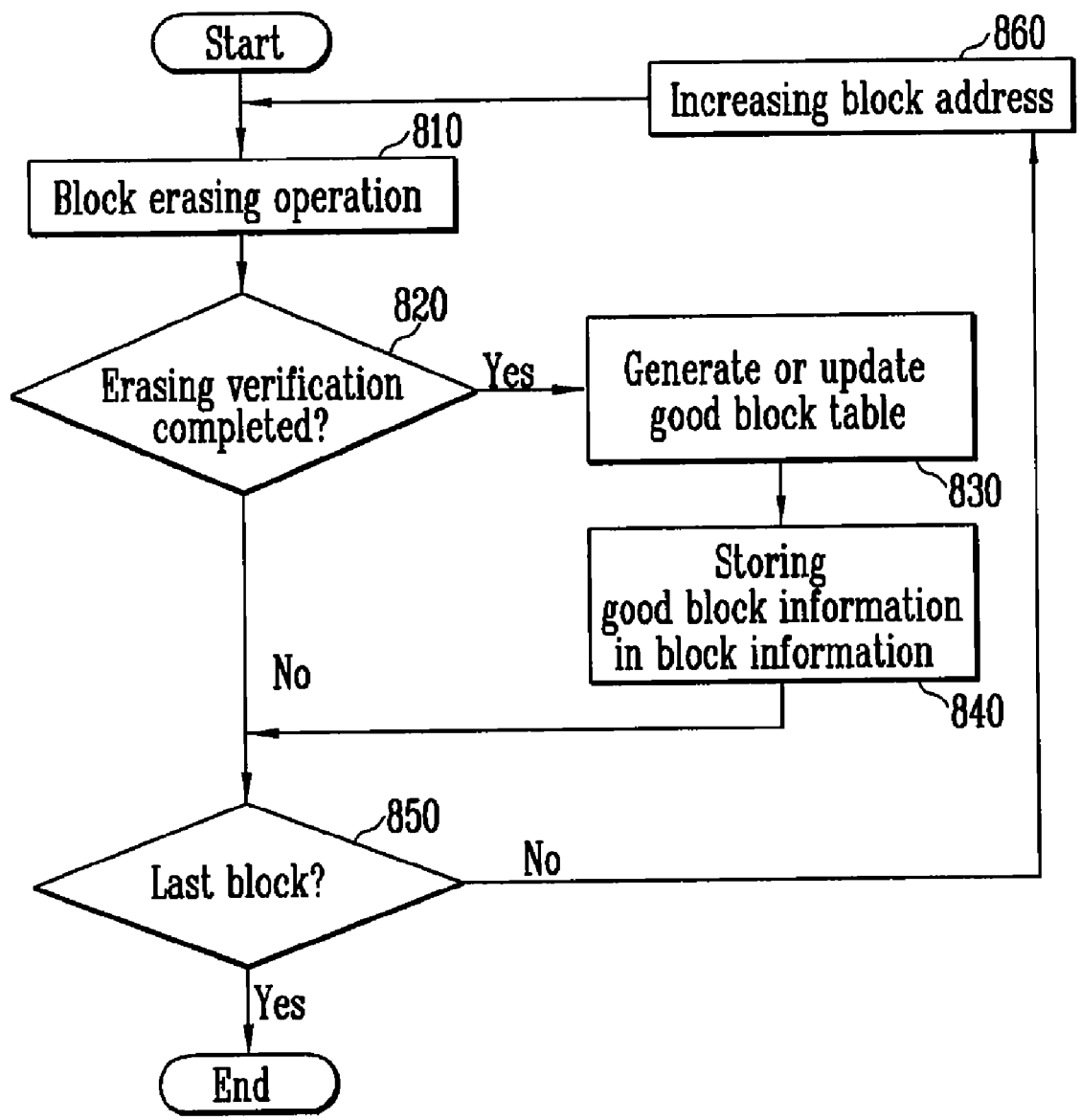
FIG. 8 is a flow chart illustrating a method for performing an erase operation in a nonvolatile memory device in accordance with still another embodiment of the present invention.

FIG. 8 is a flow chart illustrating a method for performing an erase operation in a nonvolatile memory device is in accordance with still another embodiment of the present invention.

An erase operation is performed for a specified block of a plurality of blocks (810).

A determination is made whether an erase verification is completed for the block having undergone the erase operation (820).

If there is a cell having a threshold voltage greater than 0 V even though the erase operation has been performed, the erase verification cannot be completed. In this case, the block is identified as a bad block during the operation of the nonvolatile memory device.

If the erase verification is completed, the corresponding block is identified as a good block. A good block table is then generated and stored, or an already generated good block table is updated (830).

The information indicating that the corresponding block is a good block is stored in the bock information storage (840).

As described above, since the data stored in the block information storage is changed by the erase operation, the information indicating that the corresponding block is a good block is stored through a program operation. Setting is made such that data such as 'AAh', 'ABh', 'ACh', 'ADh', 'AEh', and so on, in which binary digits are included, is stored as the information indicating that the corresponding block is a good block.

If it is determined in step 820 that the corresponding block is a bad block, the target of the operation is changed to a different block (850 and 860).

If the erase verification cannot be completed in step 820, the corresponding block is identified as a bad block.

A determination is made whether the current target block is the last block of the plurality of blocks (850). If the current target block is the last block, the operation is complete. Otherwise, a block address is increased (860), and the target block is changed to the block corresponding to the increased block address.

When the last block is checked, the operation is complete.

Meanwhile, in accordance with another embodiment, the block information can be stored in a bad block table rather than a good block table. That is to say, according to the algorithm shown in FIG. 7, block information can be stored in a bad block table.

If the erase verification is complete, the corresponding block is identified as a good block, and the method proceeds to step 850. If the erase verification cannot be completed, the corresponding block is identified as a bad block, and a bad block table is generated or updated.

Figure 9:
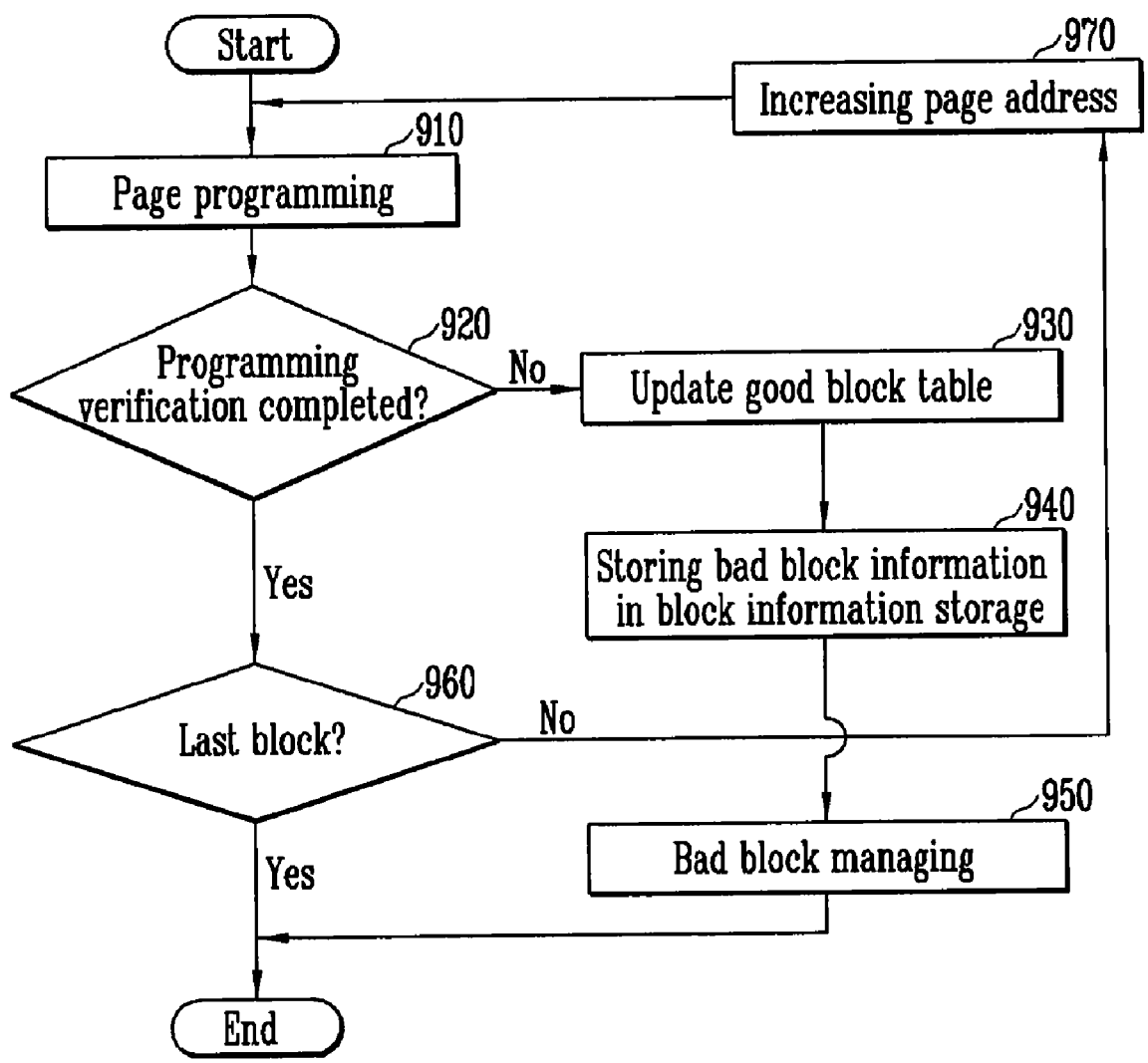
FIG. 9 is a flow chart illustrating a method for performing a program operation in a nonvolatile memory device in accordance with a still further embodiment of the present invention.

FIG. 9 is a flow chart illustrating a method for performing a program operation in a nonvolatile memory device in accordance with a still further embodiment of the present invention.

A program operation is performed by the unit of a page for memory cells included in a specified block (910).

A determination is made whether a program verification is completed for the page having undergone the program operation (920).

If there is a cell having a threshold voltage less than a reference voltage even though the program operation is performed, the program verification cannot be completed. In this case, the corresponding block is identified as a bad block during the operation of the nonvolatile memory device.

If the programming verification cannot be completed, the corresponding block is identified as a bad block, and a good block table is updated (930). That is to say, the good block table is updated such that the corresponding bad block is removed from the good block table.

If a failure occurs in a page included in the specified block, it is determined that the entire block is a bad block, and the corresponding bad block is removed from the good block table.

The information indicating that the corresponding block is a bad block is stored in the block information storage (940).

Since the data such as 'AAh', 'ABh', 'ACh', 'ADh', 'AEh', and so on, in which binary digits are included, is stored as the information indicating that the corresponding block is a good block, the data such as '00h' including only one digit 0, 'FFh' including only one digit 1, and so on, is stored as the information indicating that the corresponding block is a bad block.

The corresponding block is managed as a bad block (950).

That is to say, all the data programmed before a bad page occurs in the bad block is stored in a good block. Also, the remaining data to be programmed is programmed into a good block. This operation is performed by the control unit with reference to the good block table.

If the program verification is completed, the target of the operation is changed to a different page (960 and 970).

If the program verification is completed, the corresponding page is identified as a good page.

A determination is made whether the current target page is the last page of the plurality of pages (960). If the current target page is the last page, the operation is complete. Otherwise, a block address is increased (970), and the target page is changed to the page corresponding to the increased block address.

When the last page is checked, the operation is complete.

As is apparent from the above description, by the present invention, it is possible to provide methods for performing a fail test and block management, which can exhibit the same performance even in a nonvolatile memory device having a block switch devoid of a fuse and a PMOS transistor.

Therefore, since the same operation can be performed even though the parts are removed in the block switch, the area of a circuit can be decreased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for performing a fail test in a nonvolatile memory device, the method comprising:
    performing a fail test for a selected memory cell block of a plurality of memory cell blocks to determine whether the selected memory cell block is a good block or a bad block, wherein each of the memory cell blocks has a block information store for storing good block information;
    storing a predetermined data as the good block information in the block information store of the selected memory cell block when the selected memory cell block is a good block; and
    repeating the act of performing a fail test for a selected memory cell block and the act of storing a predetermined data as the good block information for the remaining memory cell blocks,
    wherein each of the memory cell blocks having the predetermined data stored in the block information store of the respective memory cell block is determined to be a good block, and wherein each of the memory cell blocks not having the predetermined data stored in the block information store of the respective memory cell block is determined to be a bad block.

2. The method according to claim 1, wherein the predetermined data is 'AAh', '5Ah', '55h' or 'A5h'.

3. A method for performing block management in a nonvolatile memory device, the method comprising:
    preparing the nonvolatile memory device having undergone the method according to claim 1;
    reading data stored in the block information store of a selected memory cell block of the memory cell blocks;
    storing an address of the selected memory cell block in a good block table included in a control circuit in the event that the data read from the block information store is the predetermined data; and
    repeating the reading act and the storing act for the remaining memory cell blocks.

4. A method for performing block management in a nonvolatile memory device, the method comprising:
    preparing the nonvolatile memory device having undergone the method according to claim 1;
    reading data stored in the block information store of a selected memory cell block of the memory cell blocks;
    storing an address of the selected memory cell block in a bad block table in the event that the data read from the block information store is not the predetermined data; and repeating the reading act and the storing act for the remaining memory cell blocks.

5. A method for performing an erase operation in a nonvolatile memory device, the method comprising:
   performing an erase operation for a selected memory cell block of a plurality of memory cell blocks, wherein each of the memory cell blocks includes a block information store for storing good block information;
   performing an erase verification for the selected memory cell block;
   storing an address of the selected memory cell block in a good block table included in a control circuit when the erase verification is passed, wherein the address of the selected memory cell block is not stored in the good block table when the erase verification is not passed; and
   storing a predetermined data as the good block information in the block information store of the selected memory cell block.

6. The method according to claim 5, wherein the predetermined data comprises binary data.

7. The method according to claim 5, wherein the predetermined data is 'AAh', '5Ah', '55h' or 'A5h'.

8. A method for performing a program operation in a nonvolatile memory device, the method comprising:
   preparing the nonvolatile memory device having undergone the method according to claim 7;
   performing a program operation on a page of a memory cell block, wherein the memory cell block comprises a plurality of pages;
   performing a program verification for the performed program operation;
   deleting an address of the memory cell block stored in the good block table in order not to perform a program operation on pages of the memory cell block any more in the event that the program verification cannot be passed; and
   storing bad block information in the block information store associated with the memory cell block.

9. The method according to claim 8, wherein the bad block information comprises binary data.

10. The method according to claim 8, further comprising repeating the step of performing the program operation and the step of performing the program verification on at least one other page of the memory cell block in the event that the program verification is passed.

11. The method according to claim 8, further comprising storing data that was programmed before the program operation was performed on the page in a good memory cell block in the event that the program verification cannot be passed.

12. The method according to claim 8, further comprising storing the page and data to be programmed in a good memory cell block in the event that the program verification cannot be passed.

13. A method for performing block management in a nonvolatile memory device, the method comprising:
   performing a fail test for each memory cell block of a plurality of memory cell blocks, wherein the fail test identifies the memory cell block as a good block or a bad block, each memory cell block including a block information store for storing good block information;
   storing a predetermined data as the good block information in the block information store associated with the corresponding memory cell block in the event that the fail test identifies the memory cell block as a good block, wherein block information is not stored in the block information store associated with the corresponding memory cell block in the event that the fail test identifies the memory cell block as a bad block;
   reading data stored in the block information store of each memory cell block; and
   storing an address of the memory cell block corresponding to the block information store in a good block table included in a control circuit in the event that the data read from the block information store is the predetermined data.

14. The method according to claim 13, further comprising storing an address of the memory cell block corresponding to the block information store in a bad block table in the event that the data read from the block information store is not the predetermined data.

15. The method according to claim 13, wherein the predetermined data comprises binary data.

16. A method for performing block management in a nonvolatile memory device, the method comprising:
   performing a fail test for each memory cell block of a plurality of memory cell blocks, wherein the fail test identifies the memory cell block as a good block or a bad block, each memory cell block including a block information store for storing good block information;
   storing a predetermined data as the good block information in the block information store associated with the corresponding memory cell block in the event that the fail test identifies the memory cell block as a good block, wherein block information is not stored in the block information store associated with the corresponding memory cell block in the event that the fail test identifies the memory cell block as a bad block;
   reading data stored in the block information store of each memory cell block; and
   storing an address of the memory cell block corresponding to the block information store in a bad block table in the event that the data read from the block information store in not the predetermined data.

17. The method according to claim 16, wherein the predetermined data comprises binary data.

18. The method according to claim 16, further comprising storing an address of the memory cell block corresponding to the block information store in a good block table in the event that the data read from the block information store is the predetermined data.

* * * * *